United States Patent [19]
Pfaff

[11] Patent Number: 5,556,293
[45] Date of Patent: Sep. 17, 1996

[54] MOUNTING APPARATUS FOR BALL GRID ARRAY DEVICE

[76] Inventor: Wayne K. Pfaff, 309 Steeplechase, Irving, Tex. 75062

[21] Appl. No.: 382,489

[22] Filed: Feb. 1, 1995

Related U.S. Application Data

[63] Continuation-in-part of Ser. No. 258,348, Jun. 10, 1994, Pat. No. 5,419,710.
[51] Int. Cl.⁶ .................................................. H01R 11/22
[52] U.S. Cl. .......................................... 439/266; 439/259
[58] Field of Search ................................. 439/54, 68–71, 439/83, 259, 260–266, 912

[56] References Cited

U.S. PATENT DOCUMENTS

| | | | |
|---|---|---|---|
| 4,420,205 | 12/1983 | Kirkman | 439/266 |
| 4,739,257 | 4/1988 | Jenson et al. | 439/263 X |
| 5,073,117 | 12/1991 | Malhi et al. | 439/912 X |
| 5,281,160 | 1/1994 | Walkup et al. | 439/266 |

*Primary Examiner*—Khiem Nguyen
*Attorney, Agent, or Firm*—Jack A. Kanz

[57] ABSTRACT

Ball grid array devices are mounted in a burn-in and test socket which has a top surface with windows for the ball terminals depending from the ball grad array device. Contact fingers mounted on the base of the socket extend through a cam plate and into the windows from the opposite side of the top surface. When the cam plate is moved laterally with respect to the top surface, the ends of the contact members are moved into contact with the ball terminals. The ends of the contact members are curved to contact the ball terminals between the center of the ball terminal and the surface of the ball grid array device, thus retaining the device in the socket.

23 Claims, 6 Drawing Sheets

MOUNTING APPARATUS FOR BALL GRID ARRAY DEVICE

This application is a continuation-in-part of application Ser. No. 08/258,348 filed Jun. 10, 1994, now U.S. Pat. No. 5,419,710 entitled Mounting Apparatus for Ball Grid Array Devices.

This invention relates to electronic device mounting and testing apparatus. More particularly, it relates to socket apparatus for holding and making electrical contact with the input/output terminals of ball grid array devices during testing, burn-in and the like.

Advances in microelectronics technology tend to develop device chips which occupy less space while performing more functions. As a result, the number of electrical interconnections between the chip and external circuitry required for the circuit in the chip to communicate with the outside world increases and the physical size of each such interconnection must decrease. In order to provide electrical communication between the chip and external circuitry, circuit chips are usually contained within a housing or package which supports interconnection leads, pads, etc., on one or more of its external surfaces. In order to reduce overall lead length from chip to external circuitry and to provide adequate spacing between input/output terminals on the package, high pin count devices are usually mounted in packages in which the input/output terminals are arranged in a grid pattern on one face of the package. The terminals may be in the form of pins extending from the package (usually described as a pin grid array or PGA) or contact pads or lands (usually described as a land grid array or LGA) on the surface of the package. To physically secure the chip to a substrate and provide electrical connection between its terminal pads and similar interconnect pads on the surface of a substrate such as a circuit board or the like on which the package is to be mounted, a small drop or ball of solder or the like is secured to each terminal pad on the device package. Since the solder drop forms a ball-like protrusion extending from the terminal pad, such devices are ordinarily described as ball grid array (or BGA) devices.

While the term "ball grid array device" is usually applied to a device package which has substantially spherical contacts extending from one face thereof, the term is also applied to other structures. For example, bare (unencapsulated) chips are sometimes provided with a grid array of ball-shaped contacts for mounting in a package. However, at some point during fabrication, the bare chip with ball-shaped contacts is fairly described as a ball grid array device. Similarly, finished chips are sometimes provided with terminal pads on one surface with ball-like deposits of solder forming interconnections on the terminal pads. The chip is then inverted and attached directly to a corresponding pattern of interconnect pads on a substrate. When heated, the solder balls reflow forming electrical and physical connections. This process (sometimes referred to as "flip-chip" technology) obviously uses devices which may be described as ball grid array devices. Accordingly, for purposes of this disclosure the term "ball grid array device" means any structure, including device packages, flip chips and bare dies, carrying a plurality of substantially ball-shaped interconnections on one face thereof which are arranged in a substantially grid-like pattern. The ball terminals are substantially spherical and are arranged on one surface of the device package in a predetermined pattern. Since the ball terminals are substantially spherical and uniform in size, each ball terminal has a geometric center which is spaced from the surface of the device package from which the ball terminal depends and the geometric centers of the ball terminals lie substantially in a plane (or planes) parallel with the surface of the device package from which the ball terminals depend. This plane (or the corresponding plane for each individual ball terminal) is referred to herein as the center, centerline or extended centerline of the ball terminal.

Many electronic devices are subjected to testing and burn-in at some point during or after the fabrication process. For burn-in and testing, the device must be removeably mounted on a test fixture which provides electrical connection with each of the input/output terminals while the device is functionally tested and evaluated. In many cases the device is subjected to harsh environmental conditions (such as heat, etc.) as well as electrical stresses to evaluate and assure full functionality of the finished device. In order to provide for effective testing and burn-in, the fixture in which the device is mounted for testing and burn-in must permit rapid and easy insertion and removal without damage to the device, the device package or the delicate ball terminals. However, the very features of the ball grid array device which make it attractive as a device structure (i.e., closely grouped very small contacts arranged on a hidden face) make it extremely difficult to reliably mount in a test socket without damaging the device structure.

In conventional test structures the ball grid array device is positioned on an interconnect substrate having interconnect pads corresponding to the ball grid array pattern. The ball grid array device is positioned on the substrate so that the terminal balls are individually in contact with interconnect pads on the test substrate. However, to maintain the ball grid array device in the proper position and orientation for testing, a lid or cover must be used which entraps the device and maintains the ball grid array in register and contact with the interconnect pads. Unfortunately, the entrapping lid interferes with proper circulation of cooling air around the device and precludes use of heat sinks even though the device may be designed to operate only in connection with a particular heat sink. Such lids or covers are also difficult to manipulate, may cause damage to the device and generally prevent automated loading and unloading of the test sockets.

The present invention avoids the difficulties of the prior art by providing a mounting housing or socket with an open top. No lids, covers, etc., are required. Thus the top face of the device under test is available for attachment of a heat sink or open to cooling air or the like. Furthermore, since the top of the socket or mounting housing is open, devices to be tested can be inserted and removed by automated gravity fed processes without fear of damaging the devices or the mounting apparatus.

The socket or mounting housing of the invention comprises a top support member having a top face with a plurality of windows arranged therein to receive the array of interconnection terminal balls depending from the face of the ball grid array package. The socket also includes a base member in which a plurality of axially elongated finger-like contact members or pins are anchored. One end of each contact member extends through the base to provide an attachment tail which may be soldered to a burn-in board or the like. The opposite or free end of each finger projects into one of the windows and is positioned adjacent one side of the window. The central portion of each finger (between the free end and the base) extends through an aperture in a bending or biasing plate mounted substantially parallel with and between the base and the support member. The biasing plate may be moveable laterally with respect to the support member to move the free ends of the contact fingers with respect to the windows but is ordinarily secured in a fixed position with apertures therein offset with respect to the anchored position of the tail and the windows in the support member. The offset bends or biases the central portion of each contact member to produce a curve in each finger as it extends between the top support member and base member.

A cam plate having a plurality of openings therein and adapted for lateral movement is positioned between the support member and the biasing plate. The free ends of the contact fingers project through openings in the cam plate and extend into the windows in the support member.

The contact members are mounted so that when the socket is in the open configuration the free end of each contact finger is adjacent one side of a window. When a ball grid array device is positioned on the top face of the support member, the terminal balls project or depend into the windows. In the preferred embodiment, a cam is used to move the cam plate laterally, thus simultaneously and uniformly moving the free ends of all the contact fingers in the same direction. The free ends are thus urged into contact with the terminal balls occupying the windows. The extreme end portion of each finger is positioned adjacent the top of the window. Thus, when the free end of the contact member is moved by the cam plate, it contacts the terminal ball between the horizontal centerline of the terminal ball and the face of the ball grid array device from which the terminal ball depends. The fingers thus provide individual electrical contact to each ball and, since they contact the balls above their centerlines (between the center of each ball and the device face from which it depends), they retain the balls in their respective windows and thus entrap the ball grid array device. Since the ball grid array device is held in place by the free ends of the contact members, the size of the balls may vary within limits without affecting the trapping effect of the contact fingers.

Because of the simplicity of design and operation, the socket devices of the invention may be made from a wide variety of available materials. Since the top of the socket is open, automated processes may be employed to load and unload the socket without damage to the devices or the socket and the top surface of the device is exposed for cooling and/or attachment of a heat sink. Other features and advantages of the invention will become more readily understood from the following detailed description taken in connection with the appended claims and attached drawing in which:

The terms "mounting housing" and "socket" are used synonymously herein to describe a device or apparatus for holding a ball grid array device while providing electrical contact to terminal balls depending from one face thereof. For clarity of illustration, like numerals are applied to like parts throughout the drawing.

Figure 1:
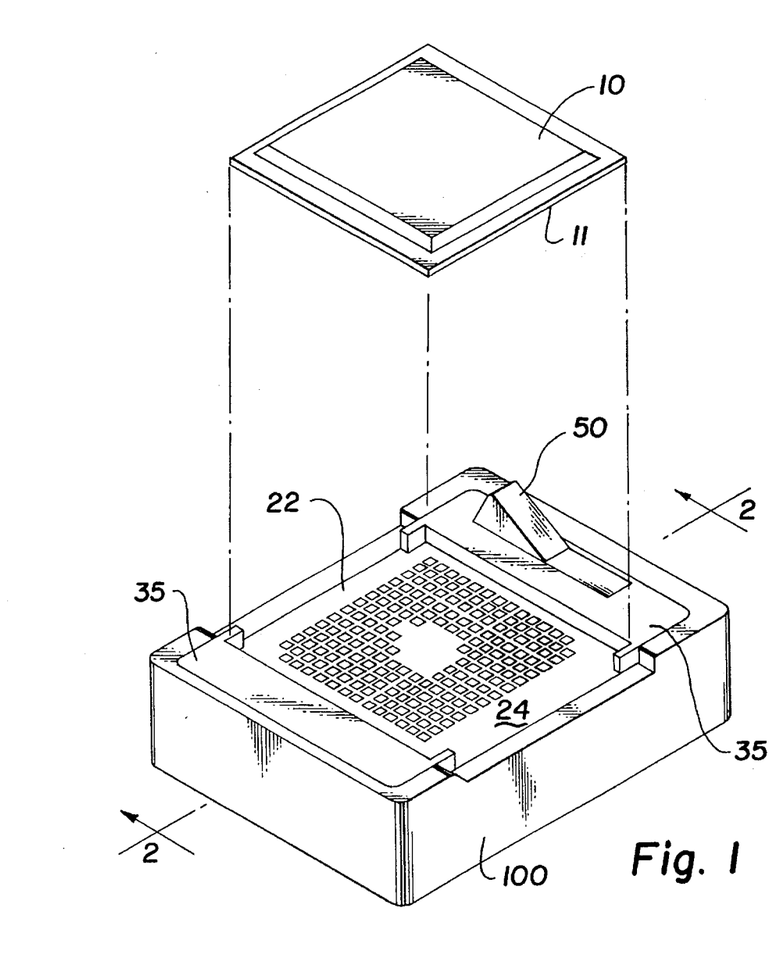
FIG. 1 is an exploded perspective view of the assembly of a ball grid array device with a preferred embodiment of the mounting housing of the invention.

Operational arrangement of a ball grid array device 10 with the mounting housing of the invention is illustrated in FIG. 1. The ball grid array of device 10 has a bottom face 11 on which are formed a plurality of spherically-shaped terminals 12. The terminals 12 are formed by depositing solder at predetermined locations on mounting pads or the like (not illustrated) on the face 11 of the device. Various methods for forming such terminal balls are known and form no part of this invention. However, the various processes are known to produce substantially spherical bodies (see FIG. 5) which depend from the lower face 11 of the ball grid array device. The terminal balls 12 are usually solder which has been deposited and heated so that it contracts into a substantially spherical shape by surface tension. Regardless of the method of manufacture, for reference purposes the ball-shaped terminals extending from the face of the ball grid array device are referred to herein as terminal balls or ball terminals.

Terminal balls 12 are arranged on the lower face 11 of ball grid array device 10 in a predetermined grid-like pattern. To accommodate the ball grid array device, the mounting housing of the invention employs a top support member 22 which has a plurality of windows 23 extending therethrough. The windows 23 are arranged in a grid pattern matching the grid pattern of the ball terminals 12. To accommodate ball grid array devices of different dimensions, the top face 24 of support member 22 may be provided with removeable spacers 35 of various sizes and configurations. The spacers 35 define the periphery of each particular ball grid array device and position the ball grid array device to prevent movement thereof laterally with respect to top face 24. Spacers 35 therefore assure that each ball grid array is aligned with the ball terminals 12 depending from the lower face 11 thereof in proper registry and orientation with windows 23 and may be changed as required for each size and shape of ball grid array device package.

Figure 2:
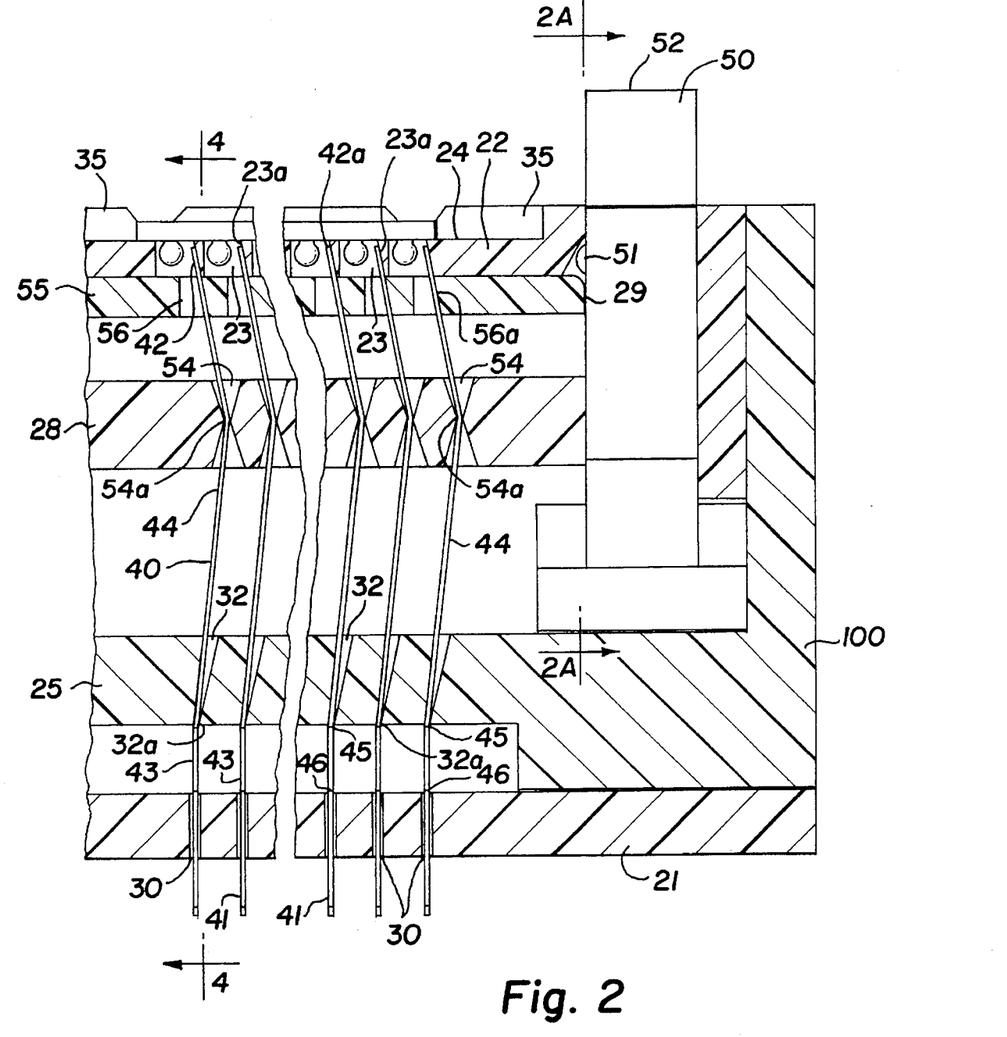
FIG. 2 is a partial sectional view of the mounting housing of FIG. 1 taken through line 2—2 showing the position of the contact fingers when the mounting housing is in the open condition.
Figure 3:
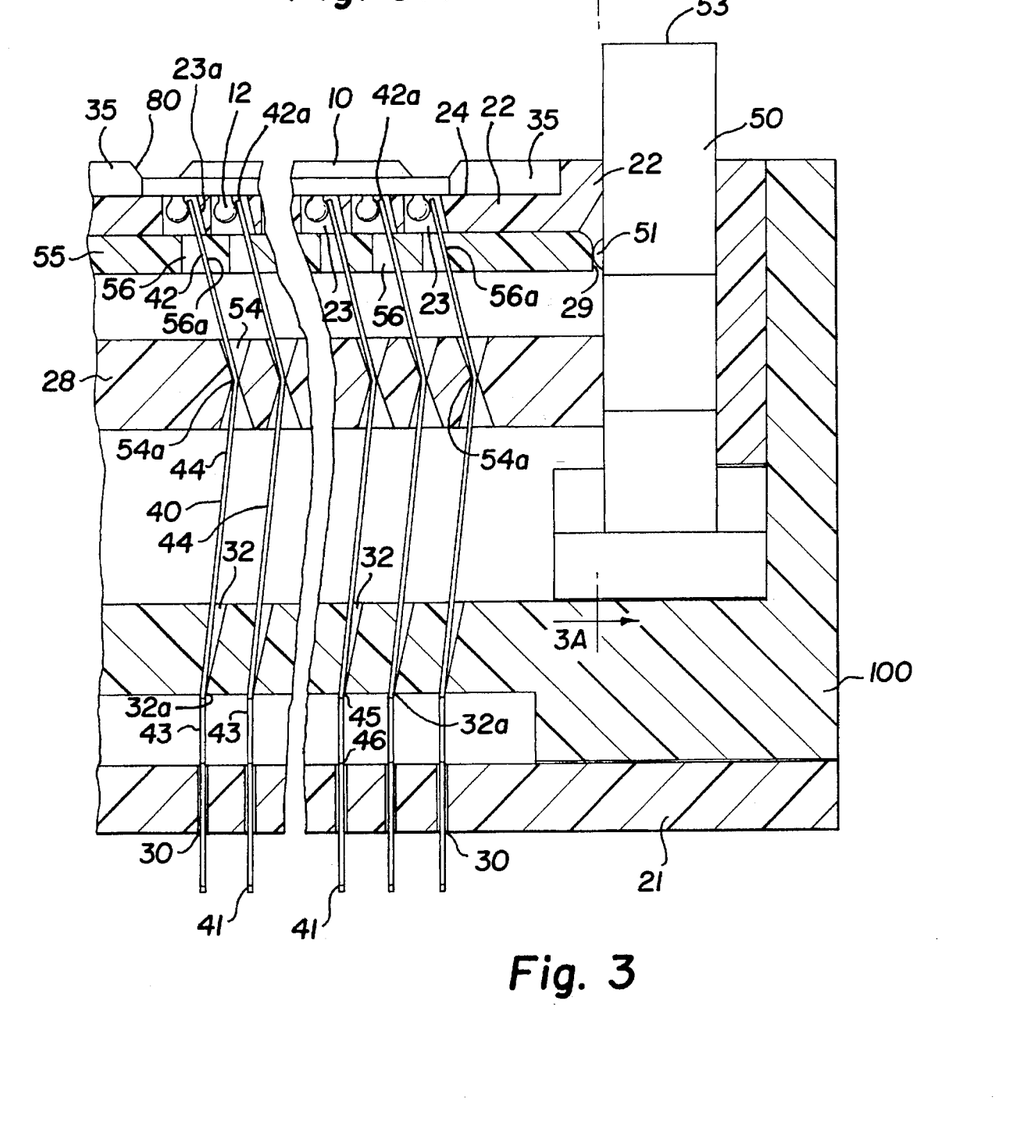
FIG. 3 is a partial sectional view of the mounting housing of FIG. 1 taken through line 2—2 showing the position of the contact fingers when a ball grid array has been inserted into the socket and the socket is in the closed position.
Figure 3A:
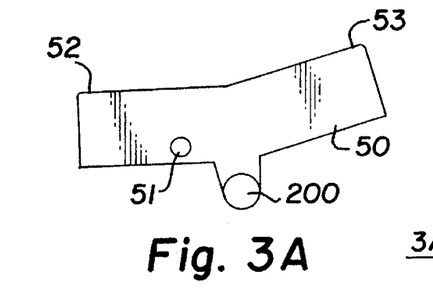
Figure 4:
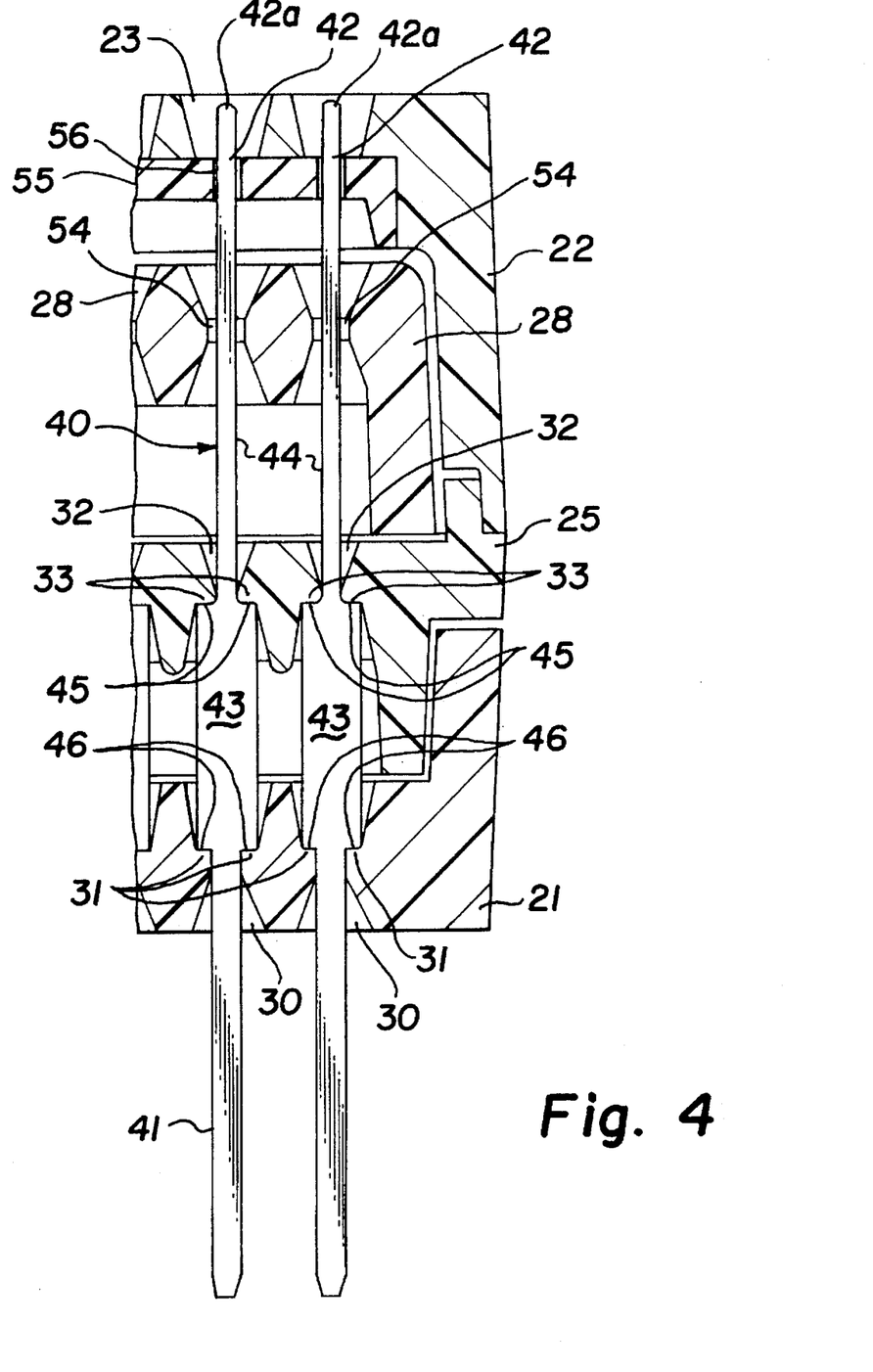
FIG. 4 is a partial sectional view of the mounting housing of FIG. 1 taken through line 4—4 of FIG. 2.

In the preferred embodiment illustrated in FIG. 1 the socket of the invention is formed of a plurality of plate-like components contained within a unitary box-like housing 100 having an open top and open bottom. As best illustrated in FIGS. 2, 3 and 4, the housing contains a base member 21 which has a plurality of apertures therein. Each aperture 30 has an internal shoulder 31 (see FIG. 4). An elongated contact member 40 is positioned in each aperture 30. In the preferred embodiment, each contact finger 40 defines an axially elongated body of resilient electrically conductive material such as nickel-coated steel or the like. The midsection 43 of each contact member 40 is substantially widened to form shoulders 45 and 46 on opposite ends thereof. Accordingly, when contact members 40 are inserted in the base member 21, tail portions 41 project through apertures 30 and shoulders 46 rest on shoulders 31. Trap plate 25 having apertures 32 and shoulders 33 in registry with and corresponding to apertures 30 is secured to base member 21. The central portion 44 of each contact member 40 extends through an aperture 32 and the shoulders 33 contact shoulders 43 on the expanded mid-sections 43 of the contact fingers 40. Accordingly, the contact members 40 are securely entrapped and held in place in the base member 21 by trap plate 25. Obviously, other arrangements may be used to secure the contact members 40 in the base 21.

The lower ends of the contact fingers 40 extend from the lower face of base support 21 to define input/output tails 41. Tails 41 may be secured in a suitable circuit board, burn-in board or the like. Alternatively, other means for making electrical contact to the circuitry of the supporting medium may be used.

The central portion 44 of each contact finger 40 which extends above the mid-section 43 projects through an aperture 54 in a bending or biasing plate 28 and terminates with the extreme free end 42a in a window 23 in top support member 22. In the preferred embodiment, the central portion 44 of each finger 40 is resiliently biased or bent into a curved shape resulting from a lateral offset between the apertures 54 in the biasing plate 28 and corresponding apertures in the base member 21 and windows 23 in top support member 22. A cam plate 55 adapted for reciprocal lateral movement is positioned between the top support member 22 and the biasing plate 28. The cam plate 55 has a plurality of apertures 56 therein corresponding with the windows 23 in top support member 22. The extreme end 42a of fingers 40 project through apertures 56 but do not extend beyond the top face 24. For best results, extreme ends 42a should be as near the top face 24 as possible. It is necessary, however, that the extreme end 42a be above the centerline of the ball terminal which it contacts.

The cam plate 55 is urged laterally by a cam lobe 51 projecting laterally from a pivoting bar 50. The cam plate 55 is positioned immediately adjacent top support member 22 and adapted for reciprocal movement laterally with respect to support member 22. Since mid-sections 43 of fingers 40 are securely anchored between the base member 21 and trap plate 25, and since the central portions of fingers 40 are curved by virtue of the offset between aperture 54 in the biasing plate 28 and window 23 in the top support plate, lateral movement of cam plate 55 in the direction of curvature of the contact member 40 causes the extreme ends 42a of the contact fingers 40 to move both laterally and slightly downwardly.

Figure 2A:
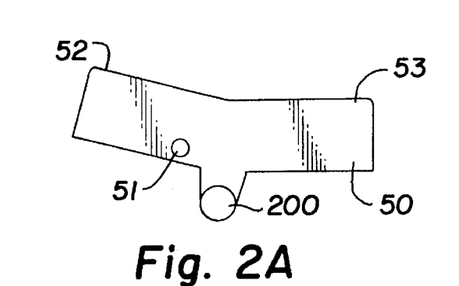
FIG. 2A, 3A is an elevational view of the pivoting bar and cam assembly used to activate the cam plate in the mounting housing of FIG. 1.

The pivoting bar 50 includes a first end 52 and a second end 53 projecting in substantially opposite directions from an axial pivot 200 and is adapted to pivot thereabout between a first position and a second position. A cam lobe 51 projects from the face of the pivoting bar 50. When the pivoting bar 50 is positioned with the first end 52 above the second end 53 (as illustrated in FIGS. 1, 2 and 2A) the cam lobe 51 is positioned above the cam plate 55 and the socket is in the open position. When downward vertical force is applied to the first end 52 pivoting bar 50 rotates about pivot 200 until the second end 53 is above the first end 52. As the pivoting bar 50 rotates, the cam lobe 51 engages the end surface 29 of the cam plate 55 and urges the cam plate 55 laterally. Movement of cam plate 55 forces the extreme ends 42a in the same direction, causing them to traverse the windows 23. It should be recognized that a pivoting bar 50 with a cam lobe 51 is only one preferred means for moving cam plate 55. Other camming mechanisms such as rotating cam shafts, wedge plates, ratchets, plungers, rack-and-pinion arrangements and the like may be designed to perform the relative movement function of the cam. Thus the terms "cam" and "cam plate" are used herein to describe any mechanical arrangement which moves the extreme ends 42a of the contact fingers 40 laterally with respect to the windows in the top support member 22 or vice versa.

The position of the contact members 40 when the socket is in the open position is illustrated in FIG. 2. A slanted shaping surface 32a in trap plate 25 permits central portion 44 of contact member 40 to bend toward the corresponding laterally offset aperture 54 in biasing plate 28. Slanted shaping surfaces 23a in top support member 22 and 56a in cam plate 55, respectively, also permit the contact members 40 to bend toward the corresponding laterally offset apertures 54 in trap plate 28 and window 23. Apertures 54 progressively widen with distance from the center to the upper and lower surfaces of biasing plate 28, thus allowing contact members 40 to resiliently flex around a bending point 54a. Elastic forces in contact 40 firmly bias the extreme ends or tips 42a against the shaping surface 23a in window 23. Contact members 40 may be pre-shaped to conform substantially to the configurations illustrated in FIGS. 2 and 3. However, the contact members 40 are preferably normally straight sections of thin metal ribbon or the like which are drawn into the configurations illustrated by placement in the manner described. Where the contact members are normally straight, the curvature of the contact members as they pass through apertures 30 and 54 may not be as sharp as illustrated. Regardless of the manner in which the contact members 40 are formed or mounted, it is only necessary that, when assembled, the free ends 42a deviate from the major axis of the contact member so that when the free end 42a is urged into physical contact with a terminal ball 12, the free end contacts the terminal ball between the centerline of the terminal ball and the face from which it depends.

If desired, a spring (not shown) may be positioned between the housing 100 and the end of the cam plate 55 opposite end 29 to ensure that the cam plate 55 is fully retracted. Accordingly, a ball grid array device may be positioned with the ball terminals 12 depending into windows 23 by simply positioning the ball grid array in the proper position. Since the free ends 42a are adjacent the sides of the windows 23, the ball terminals 12 simply depend into windows 23. Thus, no pressure is applied to any portion of the ball grid array device 10 or the depending ball terminals 12. Furthermore, no force is applied (other than gravitational) to any portion of the socket by the electronic device package or the ball terminals.

When the ball grid array device is securely in place, pivoting bar 50 is rotated to urge lobe 51 into contact with the end surface 29 of cam plate 55. As cam plate 55 is moved (to the left as shown in FIGS. 2 and 3) by lobe 51, the extreme ends 42a of the contact fingers 40 uniformly and simultaneously move into contact with the ball terminals 12 depending into the windows 23.

Figures 1A, 1B:
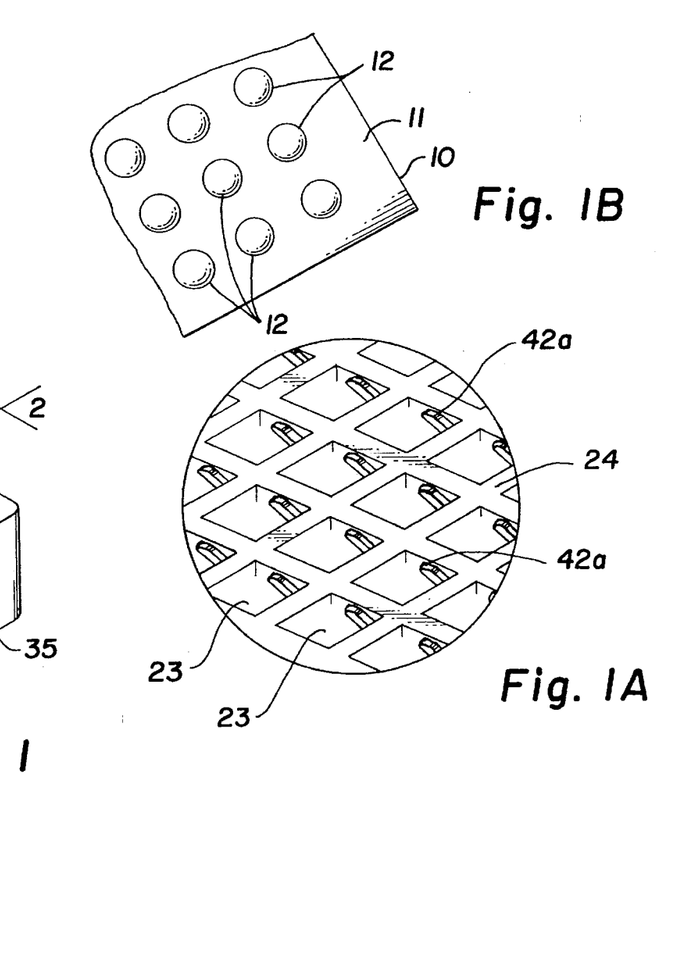
FIG. 1A is an exaggerated fragmentary view of the top surface of the mounting housing of FIG. 1.
FIG. 1B is an exaggerated fragmentary view of the ball grid array surface of the ball grid array device of FIG. 1.
Figure 5:
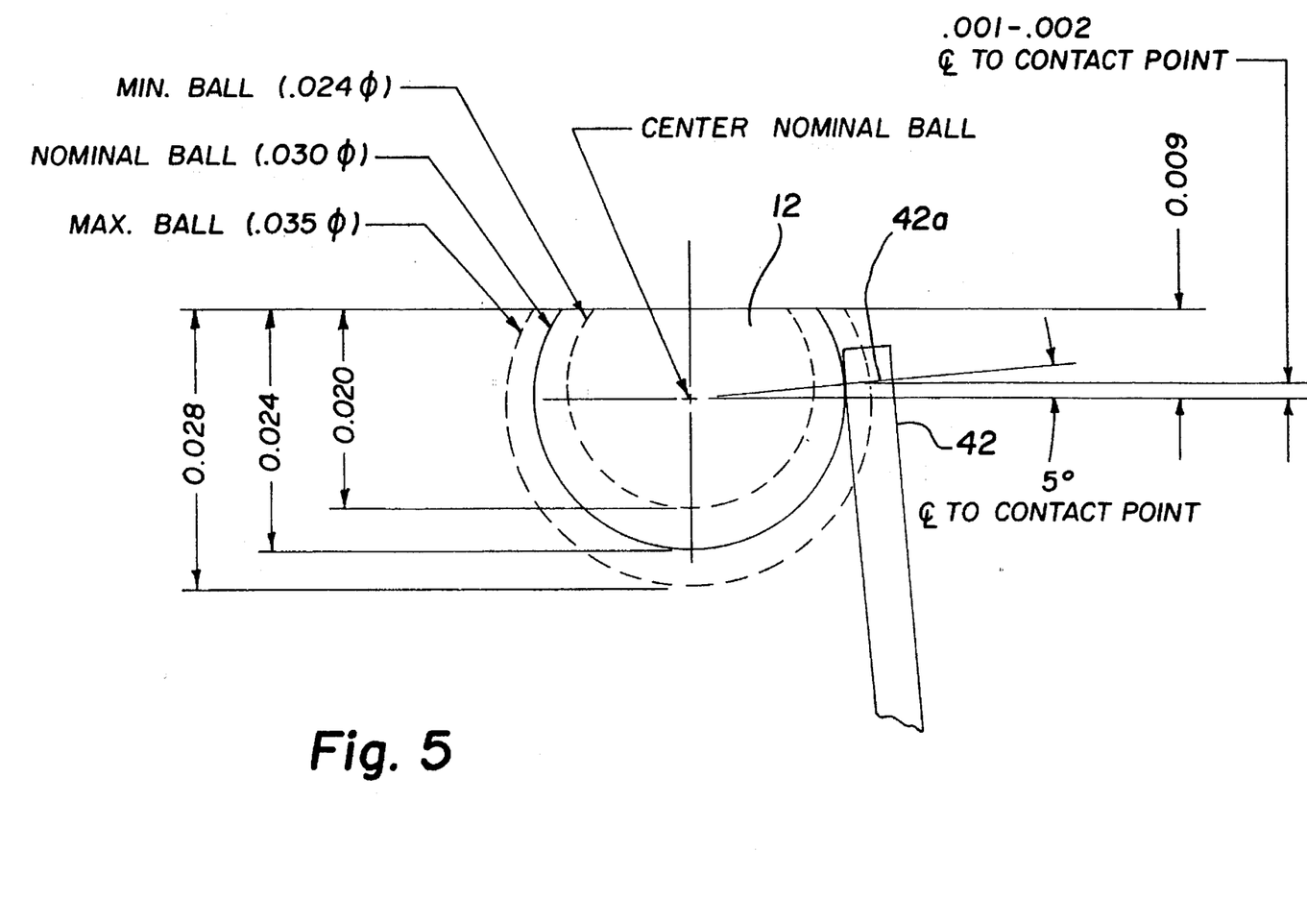
FIG. 5 is a diagrammatic representation of the relationship between the free ends of the contact fingers and terminal balls of various nominal ball sizes extending from the surface of ball grid array device.

As best shown in FIG. 1A and graphically illustrated in FIG. 5, the extreme ends 42a of contact fingers 40 are positioned to extend into windows 23 near surface 24 but do not extend beyond surface 24. Furthermore, since the contact members 40 are biased to form a curve by the relative positions of the bending plate 28, the base 21 and the top support member 22, the extreme ends 42a deviate from the vertical toward the ball terminal 12. As illustrated in FIG. 5, the extreme end 42a must extend above the centerline of the ball terminal 12. For representative purposes, FIG. 5 illustrates the relative position of extreme end 42a in contact with a ball terminal when the nominal ball size is 0.030 inch. Nominal ball sizes of 0.030 inch may vary from about 0.035 to about 0.024 inch in diameter. Thus the point of contact on the ball may vary slightly with variations in ball size.

However, as shown in FIG. 5, where the extreme end 42a extends at least 0.001 to about 0.002 inch above the extended centerline (the horizontal line passing through the center of the ball terminal 12), the point of contact between the extreme end 42a of contact finger 40 will be above the extended centerline of the ball terminal 12. Thus, since the ball grid array device 10 is trapped and prevented from horizontal movement by spacers 35, pressure exerted against the ball terminals 12 by extreme ends 42a of the contact fingers 40 have both a lateral force component and a small downward force component. The ball grid array device 10 is thus trapped and secured against the top face 24 of the support member 22 by the lateral and downward pressure exerted on each ball terminal 12 by each contact finger 40. The pressure exerted on each ball terminal 12 will be dependent, of course, on the length and inclination of end section 42 of the contact member 40 from the vertical major axis of the contact member 40, the resiliency of contact member 40, and the movement of cam plate 55. These parameters may be controlled as desired.

The relative positions of the components of the mounting housing and the ball grid array device when the housing is in the closed condition is illustrated in FIG. 3. Note that lobe 51 on pivoting bar 50 has forced cam plate 55 to the left as shown in FIG. 3. The extreme ends 42a of contact fingers 40 have moved in the same direction until they contact the surfaces of ball terminals 12. As the cam plate 55 moves further to the left, the free end 42 of each contact finger 40 is bowed until a contact pressure of approximately thirty-five (35) grams is applied to each ball terminal. Since the extreme end 42a of the contact finger 40 is above the centerline of each of ball terminal 12, this pressure securely locks the entire ball grid array device adjacent the top surface 24 of the mounting housing and each contact finger 40 is in electrical contact with a ball terminal 12 for electrical function testing, etc. However, a pressure in the range of about thirty-five (35) grams is insufficient to damage or dislodge the ball terminals 12. Since each terminal ball is contacted above its horizontal centerline, damage to the balls below the centerlines is avoided, thus enabling the balls to from proper solder joints. Furthermore, additional flexing of the contacts 40 after the tip 42a initially contacts the solder ball results in a scrubbing action which penetrates surface oxidation on the ball terminals, thus providing better electrical continuity.

After testing, burn-in or other procedures have been applied to the ball grid array device 10, the device is released by merely rotating pivoting bar 50 in the opposite direction, permitting the contact fingers 40 (and springs, if included) to urge cam plate 55 in the opposite direction and permitting the extreme ends 42a to return to and lie adjacent the angled side 23a of window 23. The apparatus of the invention therefore provides a totally zero insertion force open top socket for mounting ball grid array devices for testing and burn-in. The test device may be simply inserted into the open top of the mounting housing by gravity. No force (other than gravity) is applied to the device package or the ball terminals 12 during insertion or removal.

When the socket is in the closed position, the extreme ends 42a of the contact fingers 40 each exert a lateral and downward force on each ball terminal at approximately five degrees (5°) above the plane of its centerline. The pressure exerted by each individual finger is limited so that there is no risk of damage to the ball terminals 12. Likewise, when the contact fingers 40 are withdrawn to the open position, the ball grid array device 10 may be removed simply by gravity or with a vacuum pencil or the like. It is particularly noteworthy that the invention not only permits total zero insertion force and withdrawal force, the housing 100 also contains all reactive forces applied to open and close the socket. Thus no opening or closing forces which could damage the electronic device package or the board on which the socket is mounted is ever transmitted to the device package or the board. As illustrated in FIG. 3, an edge of the device package 10 abuts edge 80 of spacer 35 which restrains movement of the device package with respect to the housing 100. (Alternatively, each ball could individually mate with a side of the window 23 in which it is located. In either case, no pressure whatsoever is applied to the top of the device package.) Furthermore, the entire top surface of the ball grid array device is exposed since no lid or cover is employed. Cooling air may be circulated thereover or a heat sink may be applied thereto. Additionally, since test devices may be gravity loaded simply by vertical movement, the test apparatus of the invention may be easily loaded and unloaded by automated equipment.

Figure 6A:
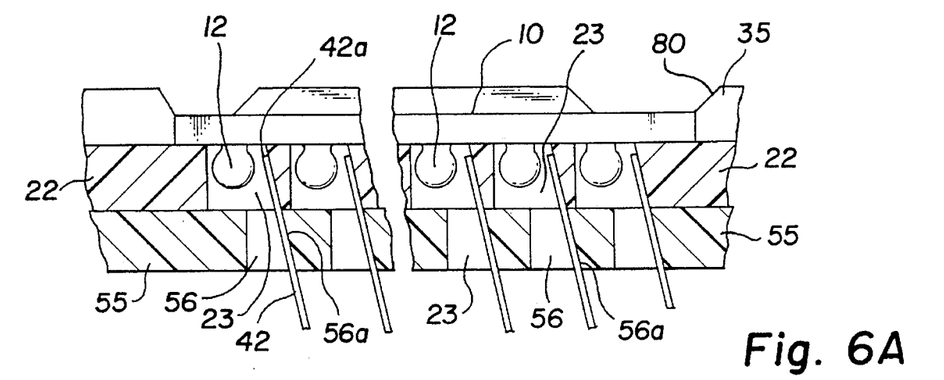
FIG. 6A is an enlarged fragmentary view of an alternative embodiment of the mounting housing of the invention illustrating the open position.
Figure 6B:
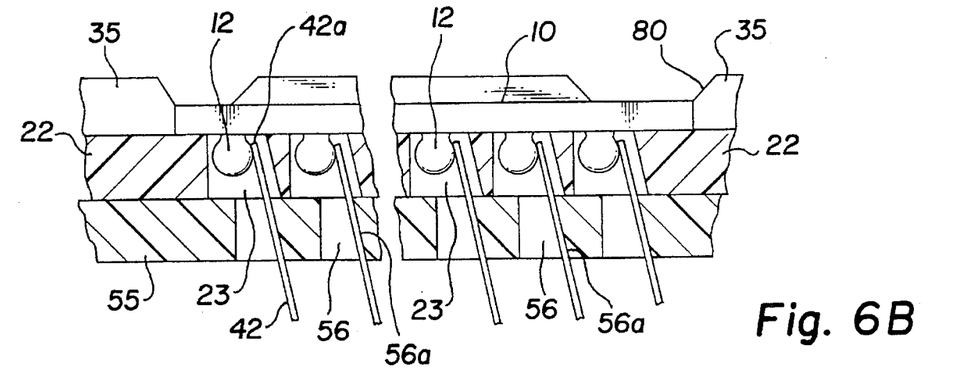
FIG. 6B is an enlarged fragmentary view of the same portion of an alternative embodiment illustrating the closed position.

It is to be understood that lateral movement of the free ends 42a with respect to the ball terminals 12 may be accomplished in a variety of ways. For example, the socket may be constructed such that the extreme ends 42a of contact fingers 40 are held stationary while the device package 10 is moved laterally. As illustrated in the alternative embodiment of FIGS. 6A and 6B, top support member 22 is adapted for lateral movement by cam lobe 51 and cam plate 55 is held stationary. In the open position (illustrated in FIG. 6A) the terminal balls 12 are positioned in windows 23 as described above. As top support member is moved laterally (to the right as shown in FIG. 6B) the terminal balls 12 are urged into contact wit the free ends 42a while the end portions 42 of the contact members 40 are maintained stationary and in the desired curved condition by the slanted sides 56a of apertures 56 in cam plate 55. Alternatively, biasing plate 28 may be adapted to move laterally with respect to cam plate 55 and the apertures 56 in cam plate 55 appropriately shaped to act as a fulcrum so that movement of biasing plate 28 in one direction causes the extreme ends 42a to move in the opposite direction. Various other arrangements will be apparent to those skilled in the art.

It will be readily recognized that the materials used for manufacturing the invention may be varied as desired, depending upon the application. Similarly, the physical size and shape of the components may be arranged to accommodate any particular ball grid array device. For example, the contact fingers 40 are shown as axially elongated metal strips and may be cut or stamped from flat ribbon stock. However, the fingers 40 could be formed from wire stock and may be formed into various configurations without departing from the principles of the invention. Similarly, the fingers may be anchored in the socket as desired by any suitable means. If the socket is to be used for burn-in purposes, heat resistant materials, of course, should be employed. The design is particularly attractive for use in hostile environments since, in its preferred embodiment, very few moving parts are employed and the opening and closing functions can be readily automated. Thus the preferred structure is extremely reliable and functional in extended repetitive use.

From the foregoing it will be recognized that the principles of the invention may be employed in various arrangements to obtain the benefit of the many advantages and features disclosed. It is to be understood, therefore, that even though numerous characteristics and advantages of the invention have been set forth together with details of the structure and function of the invention, this disclosure is to be considered illustrative only. Various changes and modifications may be made in detail, especially in matters of size, shape and arrangements of parts, without departing from the spirit and scope of the invention as defined by the appended claims.

What is claimed:

1. Apparatus for mounting a ball grid array device comprising:

(a) a support member having a support face with a plurality of windows therein arranged in a pattern to correspond with and receive terminal balls depending from the face of a ball grid array device when said device is positioned on said support face;

(b) a base member substantially parallel with and spaced from said support member;

(c) a biasing plate disposed between said support member and said base member having a plurality of apertures therein arranged in a pattern substantially corresponding with but laterally offset from said windows;

(d) a plurality of elongated contact members anchored in said base member, each having an interconnetion end and a free end disposed on opposite sides of a central section with said central section projecting through an aperture in said biasing plate and said free end positioned in a window in said support member and arranged such that central section is biased by said biasing plate to form a curve extending from said base member to said free end; and (e) means for causing relative movement between said terminal balls and said free ends to urge said free ends into contact with the terminal balls above the horizontal centerline of each said terminal ball.

2. Apparatus as defined in claim 1 wherein the free end of each contact member projects into a window but does not extend beyond said support face.

3. Apparatus as defined in claim 2 wherein each said free end is positioned adjacent one side of a window.

4. Apparatus as defined in claim 3 wherein said side of a window is inclined to urge said free end toward the opposite side of the window.

5. Apparatus as defined in claim 1 wherein said means for causing relative movement moves the free ends laterally and downwardly into contact with the terminal balls while the terminal balls are held substantially stationary.

6. Apparatus as defined in claim 5 wherein said means for causing relative movement comprises a laterally moveable plate disposed between said support member and said biasing plate.

7. Apparatus as defined in claim 1 wherein said means for causing relative movement moves the device package laterally while said free ends are held substantially stationary.

8. Apparatus as defined in claim 7 wherein said means for causing relative movement comprises a cam which urges said support member laterally.

9. Apparatus as defined in claim 1 wherein each said contact member is a substantially flat ribbon of conductive metal formed into a curved shape by its position in said base member, said biasing plate and said support member.

10. Apparatus as defined in claim 1 wherein each said contact member is a substantially flat ribbon of conductive metal formed into a curved shape by its position in said base member, said biasing plate and said means for causing relative movement between said terminal balls and said free ends.

11. Apparatus for mounting a ball grid array device comprising:

(a) a support member having a support face with a plurality of windows therein arranged in a pattern to correspond with and receive terminal balls depending from the face of a ball grid array device when said device is positioned on said support face;

(b) a base member substantially parallel with and spaced from said support member;

(c) a plurality of elongated contact members anchored in said base member, each having an interconnection end and a free end disposed on opposite sides of a central section with said central section projecting through an aperture in a biasing plate and said free end positioned in a window in said support member; and (d) a biasing plate disposed between said support member and said base member having a plurality of apertures therein arranged in a pattern substantially corresponding with but laterally offset from said windows so that the central section of each contact member curves from said base to a window; and (e) means for causing relative movement between said terminal balls and said free ends to urge said free ends into contact with the terminal balls above the horizontal centerline of each said terminal ball.

12. Apparatus as defined in claim 11 wherein the free end of each contact member projects into a window but does not extend beyond said support face.

13. Apparatus as defined in claim 12 wherein each said free end is positioned adjacent one side of a window.

14. Apparatus as defined in claim 13 wherein said side of a window is inclined to urge said free end toward the opposite side of the window.

15. Apparatus as defined in claim 11 wherein said means for causing relative movement moves the free ends laterally and downwardly into contact with the terminal balls while the terminal balls are held substantially stationary.

16. Apparatus as defined in claim 15 wherein said means for causing relative movement comprises a laterally moveable plate disposed between said support member and said biasing plate.

17. Apparatus as defined in claim 11 wherein said means for causing relative movement moves the device package laterally while said free ends are held substantially stationary.

18. Apparatus as defined in claim 17 wherein said means for causing relative movement comprises a cam which urges said support member laterally.

19. Apparatus as defined in claim 1 wherein each said contact member is a substantially flat ribbon of conductive metal formed into a curved shape by its position in said base member, said biasing plate and said support member.

20. Apparatus as defined in claim 1 wherein each said contact member is a substantially flat ribbon of conductive metal formed into a curved shape by its position in said base member, said biasing plate and said means for causing relative movement between said terminal balls and said free ends.

21. A method of mounting a ball grid array device comprising the steps of:

(a) positioning a ball grid array device with a pattern of terminal balls depending from one face thereof on a top support member having a support face with a plurality of windows therein arranged in a pattern to correspond with and receive said terminal balls;

(b) supporting a plurality of elongated contact members in a base member positioned substantially parallel with and spaced from said support member, each contact member having an interconnection end and a free end disposed on opposite sides of a central section with said central section projecting through an aperture in a biasing plate positioned intermediate said base member and said top support member with each said free end positioned in a window in said support member;

(c) a biasing each said contact member into a curve so that said free end deviates from the major axis of said contact member;

(d) moving the free end of each said contact member laterally and downwardly to contact a terminal ball between the centerline of the terminal ball and the face from which it depends.

22. A method as set forth in claim 21 wherein said free ends are moved laterally with respect to said terminal balls by a cam plate positioned between the biasing plate and the support member.

23. A method as set forth in claim 21 wherein said support member is moved laterally with respect to said biasing plate to urge said terminal balls into contact with said free ends of said contact member.

* * * * *

UNITED STATES PATENT AND TRADEMARK OFFICE
CERTIFICATE OF CORRECTION

PATENT NO.   : 5,556,293
DATED        : September 17, 1996
INVENTOR(S)  : Wayne K. Pfaff It is certified that error appears in the above-indentified patent and that said Letters Patent is hereby corrected as shown below:

Col. 9, line 26, "that central" should read ---that said central---

Signed and Sealed this

Seventeenth Day of December, 1996

Attest:

BRUCE LEHMAN

Attesting Officer        Commissioner of Patents and Trademarks